United States Patent [19]

Matsumoto

[11] Patent Number: 5,309,026
[45] Date of Patent: May 3, 1994

[54] INTEGRATED CIRCUIT PACKAGE HAVING STRESS REDUCING RECESSES

[75] Inventor: Kazuhiro Matsumoto, Tokyo, Japan

[73] Assignee: Nippon Precision Circuits Ltd., Tokyo, Japan

[21] Appl. No.: 970,366

[22] Filed: Nov. 2, 1992

[30] Foreign Application Priority Data

Nov. 19, 1991 [JP] Japan .................................. 3-303445

[51] Int. Cl.⁵ .............................................. H01L 23/28
[52] U.S. Cl. ...................................... 257/787; 257/730
[58] Field of Search ............... 257/787, 791, 792, 793, 257/730, 667, 669

[56] References Cited

U.S. PATENT DOCUMENTS 4,855,807  8/1989  Yamaji et al. ........................ 257/787
4,887,149 12/1989  Romano ................................ 257/730

FOREIGN PATENT DOCUMENTS 58-27347  2/1983  Japan .

Primary Examiner—Rolf Hille
Assistant Examiner—S. V. Clark
Attorney, Agent, or Firm—Jordan and Hamburg

[57] ABSTRACT

An integrated circuit device has reduced stress concentration on the IC chip for prevention of package cracks in the device. Recessed portions are formed in the package at positions corresponding to at least the corner portions of the IC chip to reduce the stress concentration generated at the corner portions of the IC chip.

1 Claim, 4 Drawing Sheets

3 RECESSED PORTIONS

3 RECESSED PORTIONS

3 RECESSED PORTIONS

3 RECESSED PORTIONS

INTEGRATED CIRCUIT PACKAGE HAVING STRESS REDUCING RECESSES

FIELD OF THE INVENTION

The present invention relates to an integrated circuit device in which an IC chip is molded in a resin.

BACKGROUND OF THE INVENTION

A conventional integrated circuit device in which an IC chip is molded in a resin is constructed as shown in FIG. 10.

In the above-mentioned conventional integrated circuit device, since the coefficient of linear expansion of the molding resin is approximately ten times as high as that of the IC chip and the lead frame, strain is produced in the resin having a high coefficient of contraction, as shown by the arrow in FIG. 11, due to a difference in temperature between the molding process at about 170°C. in general and the cooling process at room temperature. As a result, stress is concentrated at the corner portions of the IC chip, thus raising a problem in that package cracks and passivation cracks are easily produced.

SUMMARY OF THE INVENTION

The object of the present invention is to provide an IC device which can prevent the package cracks and reduce the stress concentration to the IC chip.

BRIEF DESCRIPTION OF THE DRAWINGS

An embodiment of the present invention will be described hereinbelow with reference to the attached drawings, wherein.

DISCLOSURE OF THE PREFERRED EMBODIMENTS

Figure 1:
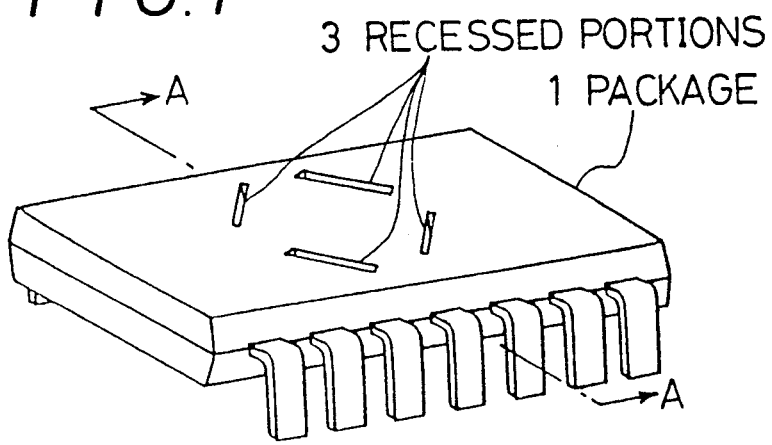
FIG. 1 is a perspective view showing an embodiment of the present invention.
Figure 2:
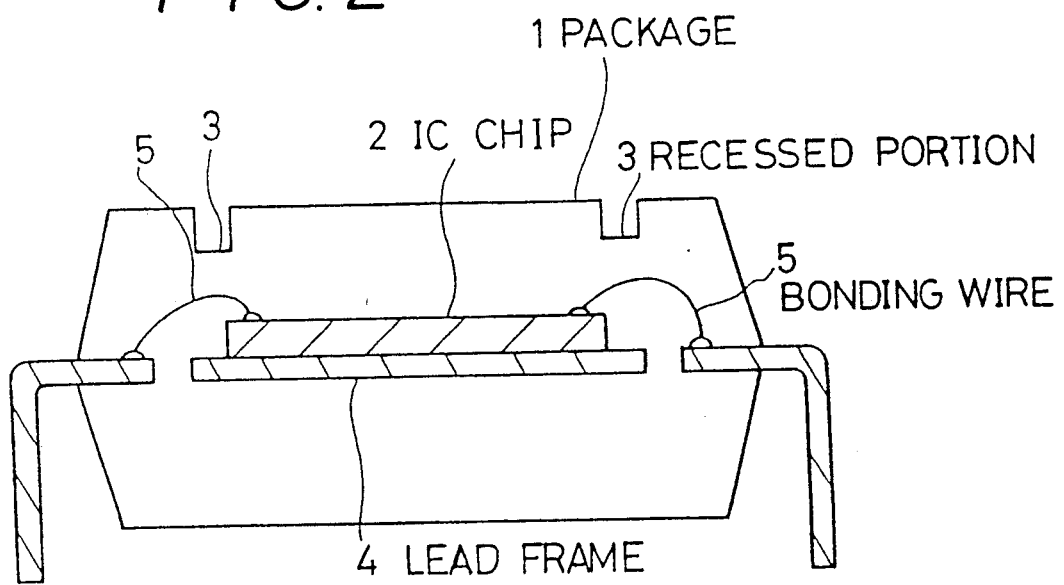
FIG. 2 is a cross-sectional view taken along the line A—A in FIG 1.

In FIG. 1, the reference numeral 1 denotes a package formed of a resin such as epoxy resin, which can be obtained by molding an IC chip 2 as shown in FIG. 2 with a resin. The reference numeral 3 denotes recessed portions, which are formed at positions corresponding to at least the corner portions of the IC chip 2. It is preferable to form the recessed portions to have a depth of 0.1 mm to 2.0 mm and a width of 0.1 mm to 2.0 mm. The reference numeral 4 denotes a lead frame, and the numeral 5 denotes a bonding wire.

By forming the recessed portions 3 as described above, at least at the corner portions of the IC chip 2, it is possible to reduce the stress concentration generated at the corner portions of the IC chip 2.

Figure 3:
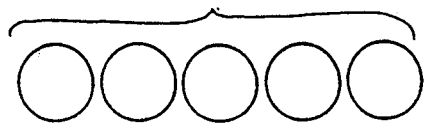
FIG. 3 is an illustration showing another embodiment of the recessed portions shown in FIG. 1.
Figure 4:
FIG. 4 is an illustration showing another embodiment of the recessed portions shown in FIG. 1.
Figure 5:
FIG. 5 is an illustration showing another embodiment of the recessed portions shown in FIG. 1.
Figure 6:
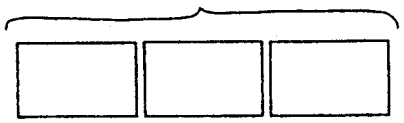
FIG. 6 is an illustration showing another embodiment of the recessed portions shown in FIG. 1.

The recessed portions 3 in accordance with the invention are not limited in shape to only that as shown in FIG. 1; that is, it is also possible to arrange a plurality of circular recessed portions in series as shown in FIG. 3, or alternatively to arrange the recessed portions of series of other shapes as shown in FIGS. 4, 5 and 6, respectively. In addition, it is possible to obtain a similar effect by forming the recessed portions with shapes that are different from the above.

Thus, as illustrated in FIG. 3, the recesses 3 form a series of circular shapes in the surface of the resin package, while in FIG. 4 the recesses form a series of triangular shapes in the surface of the package. In FIG. 5 the recesses form a series of squares in the surface of the resin, while in FIG. 6 the recesses form a series of rectangles in the surface of the resin.

Figure 7:
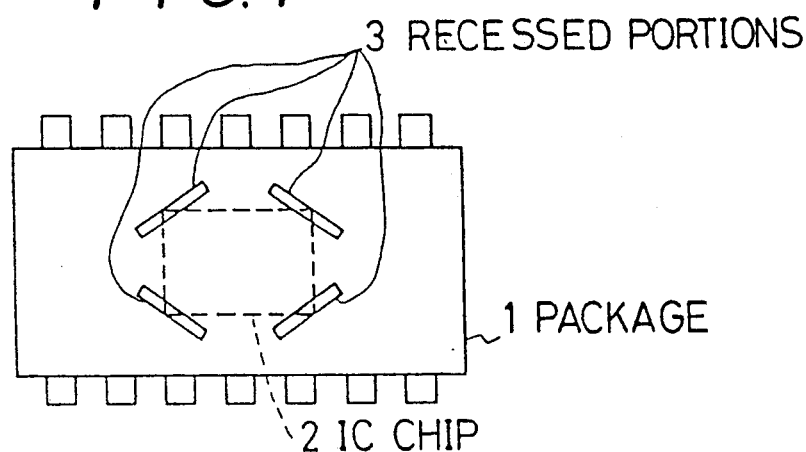
FIG. 7 is a top view showing another embodiment of the present invention.
Figure 8:
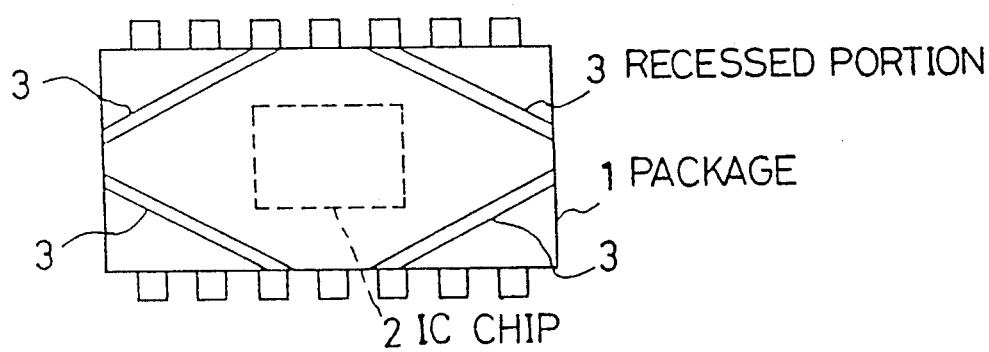
FIG. 8 is a top view showing still another embodiment of the present invention.
Figure 9:
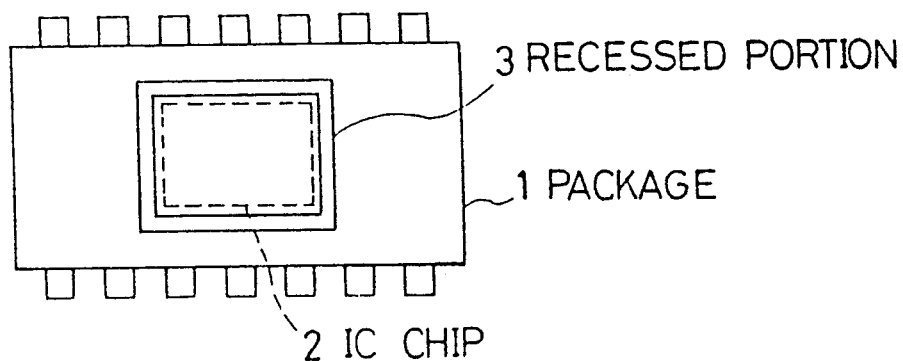
FIG. 9 is a top view showing still further another embodiment of the present invention.
Figure 10:
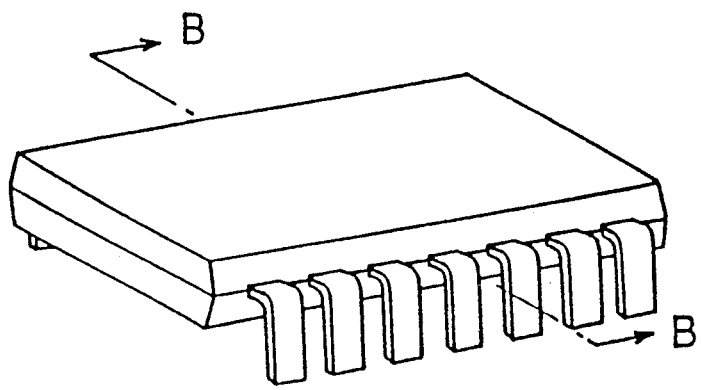
FIG. 10 is a perspective view showing a prior art integrated circuit device.
Figure 11:
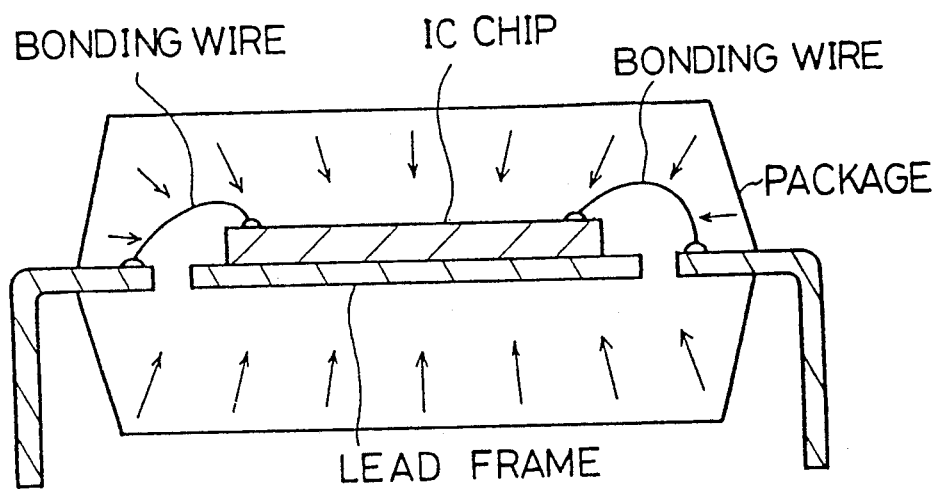
FIG. 11 is a cross-sectional view taken along the line B—B in FIG. 10.

The positions at which the recessed portions are formed are not limited to those shown in FIG. 1; that is, it is possible to form the recessed portions at any positions other than the above, as long as the positions correspond to the corner portions of the IC chip, as shown in FIGS. 7 to 9.

In the arrangement of FIG. 7, four recesses 3 are provided in the surface of the resin, with the recesses 3 being linear and each crossing a separate corner of the IC chip. The arrangement of FIG. 8 corresponds to that of FIG. 7, but in this package the recesses 3 are displaced outwardly of the corners of the IC chip. As illustrated in FIG. 9, the recess 3 has a rectangular shape in the surface of the package, with sides parallel to the sides of the IC chip.

Further it is also possible to obtain the same effect by forming the recessed portions 3 on the reverse side of the package or on both the upper and reverse sides thereof.

In the present invention, since the recessed portions are formed at positions which correspond to at least the corner portions of the IC chip on the upper and/or reverse side of the resin package, it is possible to reduce the stress concentration generated at the corner portions of the IC chip due to a difference in the coefficient of the contraction between the IC chip, the lead frame material and the resin material, so that it is possible to prevent the device from damages to the IC chip, the lead frame and the bonding wires and from the package cracks and passivation cracks.

Although the present invention has been fully described by way of example with reference to the accompanying drawings, it is to be understood that various changes and modifications will be apparent to those skilled in the art. Therefore, unless such changes and modifications depart from the scope of the invention, they should be construed as being included therein.

What I claim is:

1. An integrated circuit device wherein an IC chip is molded in a resin package and extends in a given plane in said resin package, the resin package being formed of a resin having a coefficient of contraction that is different than that of the IC chip, the IC chip having corners, the resin package having an external surface extending parallel to said plane, at least one recess in said external surface, the bottom of said recess being positioned between said given plane and said external surface of said package, said recess being positioned to reduce stress concentration at said corners of said IC chip resulting from said different coefficients of contraction, said recess having a depth of from 0.1 mm to 0.2 mm and a width of from 0.1 mm to 2.0 mm.

* * * * *